US009475987B2

(12) United States Patent
Yoo et al.

(10) Patent No.: US 9,475,987 B2
(45) Date of Patent: Oct. 25, 2016

(54) YELLOW LIGHT EMITTING PHOSPHOR AND LIGHT EMITTING DEVICE PACKAGE USING THE SAME

(71) Applicant: LG ELECTRONICS INC., Seoul (KR)

(72) Inventors: Younggil Yoo, Seoul (KR); Dongwon Kang, Seoul (KR); Gunyoung Hong, Seoul (KR); Minsung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/705,620

(22) Filed: May 6, 2015

(65) Prior Publication Data

US 2015/0344774 A1 Dec. 3, 2015

(30) Foreign Application Priority Data

May 28, 2014 (KR) .................. 10-2014-0064384

(51) Int. Cl.
  *C09K 11/77* (2006.01)
  *C09K 11/64* (2006.01)
  *H01L 33/50* (2010.01)

(52) U.S. Cl.
  CPC .......... *C09K 11/7774* (2013.01); *C09K 11/646* (2013.01); *C09K 11/7734* (2013.01); *H01L 33/504* (2013.01)

(58) Field of Classification Search
  CPC .......... C09K 11/7734; C09K 11/7773; H01L 33/504
  See application file for complete search history.

(56) References Cited

U.S. PATENT DOCUMENTS

| | | | |
|---|---|---|---|
| 7,759,692 B2 * | 7/2010 | Hata | H01L 33/54 257/100 |
| 7,781,953 B2 * | 8/2010 | Su | H01L 33/504 252/301.16 |
| 8,476,657 B2 * | 7/2013 | Kawasaki | H01L 25/167 257/100 |
| 8,653,549 B2 | 2/2014 | Yoo et al. | |
| 2007/0276606 A1 | 11/2007 | Radkov et al. | |
| 2008/0036364 A1 | 2/2008 | Li et al. | |

(Continued)

FOREIGN PATENT DOCUMENTS

| | | | |
|---|---|---|---|
| CN | 102099436 A | | 6/2011 |
| EP | 2 163 595 | † | 3/2010 |

(Continued)

OTHER PUBLICATIONS

Korean Office Action dated Aug. 8, 2014 issued in Application No. 10-2014-0064384 (with English translation).

(Continued)

*Primary Examiner* — Carol M Koslow
(74) *Attorney, Agent, or Firm* — KED & Associates, LLP

(57) ABSTRACT

Disclosed are phosphors and, more particularly, yellow light emitting phosphors and light emitting device packages using the same. The yellow light emitting phosphor includes a first phosphor including at least one of $Lu_3Al_5O_{12}$:Ce, $SrSi_2O_2N_2$, and β-type SiAlON and a second phosphor mixed with the first phosphor to form a mixture, the second phosphor including α-type SiAlON(Li-α-SiAlON) containing Li as a metal component, wherein the second phosphor emits light having a central wavelength in a range of 550 nm to 590 nm by being excited by near ultraviolet (UV) or blue light, The mixture of the first phosphor and the second phosphor is excited by the near UV or blue light to emit yellow light.

12 Claims, 5 Drawing Sheets

(56) References Cited

U.S. PATENT DOCUMENTS

| | | |
|---|---|---|
| 2009/0072255 A1 | 3/2009 | Takahashi et al. |
| 2012/0319566 A1* | 12/2012 | Sakata ............... C09K 11/0883 |
| | | 313/503 |
| 2013/0293093 A1* | 11/2013 | Nonogaki ............. H05B 33/14 |
| | | 313/503 |

FOREIGN PATENT DOCUMENTS

| | | | |
|---|---|---|---|
| EP | 2 314 659 | † | 4/2011 |
| EP | 2 314 659 A1 | | 4/2011 |
| EP | 2 543 714 A1 | | 1/2013 |
| EP | 2 921 543 | † | 9/2015 |
| JP | 2009-256558 A | | 11/2009 |
| KR | 10-2007-0103087 A | | 10/2007 |
| KR | 10-2009-0048589 A | | 5/2009 |
| KR | 10-2013-0047022 A | | 5/2013 |
| TW | 201213505 A1 | | 4/2012 |
| WO | WO 2006/118321 A1 | | 11/2006 |
| WO | WO 2010/018873 A1 | | 2/2010 |
| WO | WO 2011/108740 | | 9/2011 |
| WO | 2014/077132 | † | 5/2014 |
| WO | WO 2014/077132 A1 | | 5/2014 |

OTHER PUBLICATIONS

Korean Decision to Grant a Patent dated Nov. 25, 2014 issued in Application No. 10-2014-0064384 (with English translation).
European Search Report dated Aug. 11, 2015 issued in Application No. 15001081.7.
Taiwanese Office Action dated Jan. 14, 2016 issued in Application No. 104116852 (with English translation).

* cited by examiner
† cited by third party

YELLOW LIGHT EMITTING PHOSPHOR AND LIGHT EMITTING DEVICE PACKAGE USING THE SAME

This application claims the benefit of Korean Patent Application No. 10-2014-0064384, filed on May 28, 2014, which is hereby incorporated by reference as if fully set forth herein.

BACKGROUND OF THE INVENTION

1. Field of the Invention

The present invention relates to phosphors and, more particularly, to yellow light emitting phosphors and light emitting device packages using the same.

2. Discussion of the Related Art

Light emitting diodes (LEDs) are next-generation light emitting devices capable of substituting for fluorescent lamps, which are the most commonly used existing normal luminaires.

LEDs have less power consumption than existing light sources and may be regarded as being eco-friendly because they do not include mercury unlike fluorescent lamps. In addition, LEDs have advantages including long lifespan and high response speed as compared to existing light sources.

These LEDs may be used in conjunction with phosphors that absorb light emitted from LEDs to emit various colors of light. These phosphors may usually emit yellow light, green light, and red light.

White LEDs are currently fabricated into a combination of LEDs that emit blue light and phosphors adapted to convert emission wavelengths. Expansion in the use range of white LEDs causes requirement of more efficient LEDs and, to this end, emission efficiency of phosphors needs to be improved. In addition, demand for LEDs having greater reliability is increasing.

While yttrium aluminum garnet (YAG) phosphors, which are oxide phosphors as disclosed in U.S. Pat. No. 5,998,925, are known as yellow phosphors used in LEDs, the YAG phosphors have low thermal stability, which may problematically cause luminance deterioration and color coordinate variation at a high temperature.

In addition, while oxide phosphors and silicate-based phosphors are known as yellow and green phosphors, these phosphors have relatively low thermal stability and poor water resistance, thus being likely to have a negative effect on reliability of LED packages.

Therefore, there is a need to develop highly efficient and reliable phosphors capable of creating white light in cooperation with LEDs.

Moreover, blue LEDs may exhibit a wavelength shift to a shorter wavelength as output of the blue LEDs becomes higher and, therefore, there is a need to develop yellow light emitting phosphors that exhibit high excitation efficiency even at short wavelengths.

SUMMARY OF THE INVENTION

Accordingly, the present invention is directed to yellow light emitting phosphors and light emitting device packages using the same that substantially obviate one or more problems due to limitations and disadvantages of the related art.

One object of the present invention is to provide yellow light emitting phosphors having high emission efficiency and high luminance, and light emitting device packages using the same.

Additional advantages, objects, and features will be set forth in part in the description which follows and in part will become apparent to those having ordinary skill in the art upon examination of the following or may be learned from practice. The objectives and other advantages may be realized and attained by the structure particularly pointed out in the written description and claims hereof as well as the appended drawings.

To achieve these objects and other advantages and in accordance with the purpose of the invention, as embodied and broadly described herein, in accordance with a first aspect of the present invention, a yellow light emitting phosphor includes a first phosphor as a green-based phosphor, the first phosphor including at least one of $Lu_3Al_5O_{12}$:Ce, $SrSi_2O_2N_2$, and β-type SiAlON, and a second phosphor mixed with the first phosphor to form a mixture, the second phosphor including α-type SiAlON(Li-α-SiAlON) containing Li as a metal component, wherein the second phosphor emits light having a central wavelength located within a wavelength band of 550 nm to 590 nm by being excited by near ultraviolet (UV) or blue light, wherein the mixture of the first phosphor and the second phosphor is excited by the near UV or blue light to emit yellow light.

Here, the second phosphor may be represented by the following chemical formula 1:

$$Li_{m-2x}Eu_xSi_{12-(m+n)}Al_{m+n}O_nN_{16-n}$$

where, "m" and "n" fulfill at least one condition of $0 \le m \le 2$ and $0 \le n \le 1$.

Here, the second phosphor may be present in an amount of 40 wt % to 60 wt % when the sum of the first phosphor and the second phosphor is 100 wt %.

Here, the phosphor may have a higher excitation rate than that of an yttrium aluminum garnet (YAG) phosphor in a wavelength band of 360 nm to 460 nm of an excitation spectrum.

At this time, the phosphor may have an excitation rate of 50% or more as compared to a peak value at a wavelength of 410 nm of the excitation spectrum.

Here, the second phosphor may emit light having a central wavelength located within a wavelength band of 578 nm to 588 nm.

Here, the yellow light emitting phosphor may further include a third phosphor having a different central wavelength than the central wavelengths of the first phosphor and the second phosphor.

In accordance with a second aspect to achieve the technical object as described above, a yellow light emitting phosphor includes a first phosphor adapted to emit light having a central wavelength in a wavelength band of 530 nm to 550 nm and a second phosphor adapted to emit light having a central wavelength in a wavelength band of 550 nm to 590 nm by being mixed with the first phosphor, wherein the second phosphor is represented by the following chemical formula 1:

$$Li_{m-2x}Eu_xSi_{12-(m+n)}Al_{m+n}O_nN_{16-n}$$

where, "m" and "n" fulfill at least one condition of $0 \le m \le 2$ and $0 \le n \le 1$.

Here, the first phosphor may be a green-based phosphor and include at least one of $Lu_3Al_5O_{12}$:Ce, $SrSi_2O_2N_2$, and β-type SiAlON.

Here, the second phosphor may be present in an amount of 40 wt % to 60 wt % when the sum of the first phosphor and the second phosphor is 100 wt %.

Here, the phosphor may have a higher excitation rate than that of an yttrium aluminum garnet (YAG) phosphor in a wavelength band of 360 nm to 460 nm of an excitation spectrum.

At this time, the phosphor may have an excitation rate of 50% or more as compared to a peak value at a wavelength of 410 nm of the excitation spectrum.

Here, the second phosphor may emit light having a central wavelength in a wavelength band of 578 nm to 588 nm.

In accordance with a third aspect to achieve the technical object as described above, a yellow light emitting phosphor includes a first phosphor including at least one of $Lu_3Al_5O_{12}$:Ce, $SrSi_2O_2N_2$, and β-type SiAlON and a second phosphor adapted to be mixed with the first phosphor to form a mixture, the second phosphor including α-type SiAlON(Li-α-SiAlON) containing Li as a metal component, the second phosphor being adapted to emit light having a central wavelength in a wavelength range of 578 nm to 588 nm by being excited by near ultraviolet (UV) or blue light, wherein the second phosphor is present in an amount of 40 wt % to 60 wt % when the sum of the first phosphor and the second phosphor is 100 wt %, and wherein the mixture of the first phosphor and the second phosphor is excited by the near UV or blue light to emit yellow light.

In accordance with a fourth aspect to achieve the technical object as described above, a light emitting device package includes the yellow light emitting phosphor, and a light emitting device configured to emit near ultraviolet (UV) or blue light to excite the yellow light emitting phosphor.

It is to be understood that both the foregoing general description and the following detailed description of the present invention are exemplary and explanatory and are intended to provide further explanation of the present invention as claimed.

BRIEF DESCRIPTION OF THE DRAWINGS

The accompanying drawings, which are included to provide a further understanding of the present invention and are incorporated in and constitute a part of this application, illustrate embodiment(s) of the present invention and together with the description serve to explain the principle of the present invention. In the drawings.

DETAILED DESCRIPTION OF THE INVENTION

Figure 1:
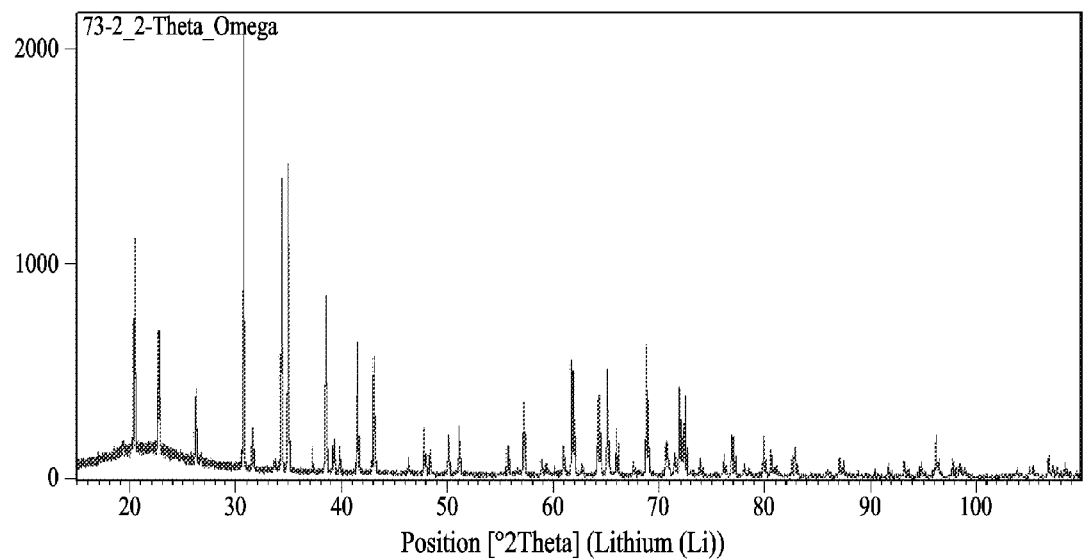
FIG. 1 is a graph showing an XRD spectrum of Li-α-SiAlON.

Hereinafter, exemplary embodiments of the present invention will be described in detail with reference to the accompanying drawings.

While the present invention is susceptible to various modifications and alternative forms, specific embodiments thereof are shown by way of example in the drawings and will herein be described in detail. It should be understood, however, that there is no intent to limit the present invention to the particular forms disclosed, but on the contrary, the present specification is to cover all modifications, equivalents, and alternatives falling within the spirit and scope of the specification as defined by the claims.

It will be understood that, when an element such as a layer, region or substrate is referred to as being "on" another element, it can be directly on the other element or intervening elements may also be present.

It will be understood that, although the terms first, second, etc. may be used herein to describe various elements, components, regions, layers and/or sections, these elements, components, regions, layers and/or sections should not be limited by these terms.

First, a yellow light emitting phosphor according to the present invention will be described.

According to the present invention, yellow light having high luminance may be produced by mixing green and amber phosphors which are excited with high efficiency by near ultraviolet (UV) and blue light as an excitation source.

To this end, the present invention may use a first phosphor including at least one of LuAG, $SrSi_2O_2N_2$ and β-type SiAlON, which are green-based phosphors exhibiting high emission efficiency via excitation by near UV and blue light.

The first phosphor may emit light of a green wavelength band by being excited by near UV and blue light. The first phosphor may have a central wavelength in a wavelength band of 530 to 550 nm.

Here, LuAG is known as a chemical formula of $Lu_3Al_5O_{12}$:Ce and β-type SiAlON may be represented by a chemical formula in which Eu is added to a basic structural formula of $Si_{6-z}Al_zO_zN_{8-z}$. In addition, LSN($La_3Si_6N_{11}$:Ce) and $SrSi_2O_2N_2$:Eu may be used as the first phosphor.

In addition, the present invention may use a second phosphor of a new composition, which exhibit excellent visibility and has an optimum emission wavelength to enable emission of high-luminance yellow light by being mixed with the first phosphor. The second phosphor may emit light of an amber wavelength band by being excited by near UV and blue light.

A mixture of the first phosphor and the second phosphor as described above may emit high-luminance yellow light by being excited by near UV or blue light. In addition, the mixture may exhibit an excellent excitation rate by near UV or blue light, thereby exhibiting a high-efficiency characteristic.

The second phosphor may include α-type SiAlON(Li-α-SiAlON) containing Li as a metal component and emit light having a central wavelength located within a band of 550 to 590 nm by being excited by near UV or blue light.

The second phosphor may be represented by the following chemical formula 1.

$$Li_{m-2x}Eu_xSi_{12-(m+n)}Al_{m+n}O_nN_{16-n}$$   Chemical Formula 1

Figure 2:
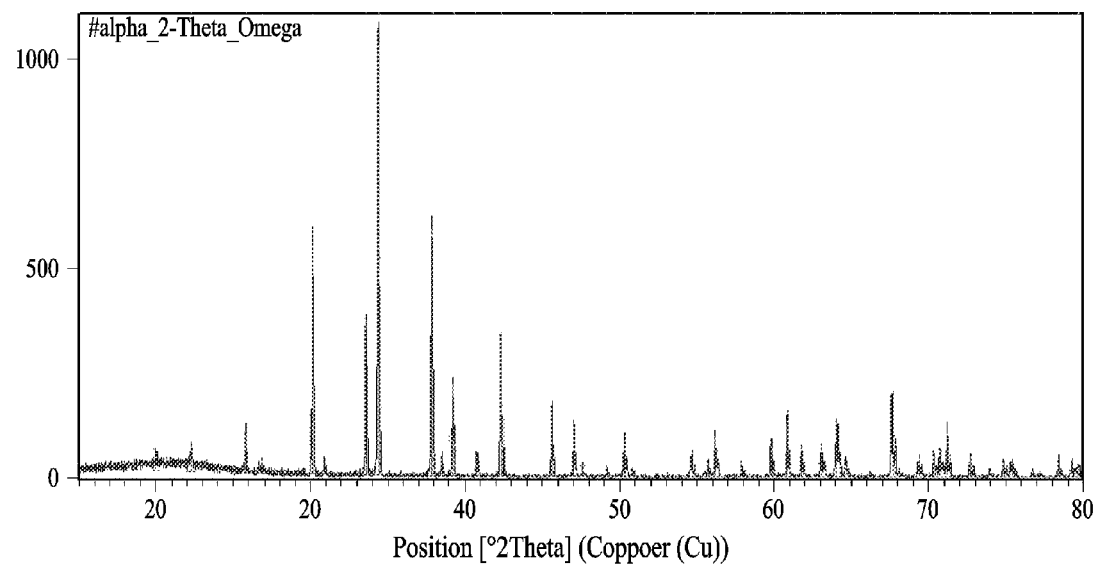
FIG. 2 is a graph showing an XRD spectrum of Ca-α-SiAlON.

It can be said that the second phosphor is a phosphor represented by Li-α-SiAlON, which is acquired by substituting a metal component of α-type SiAlON $(Ca_{0.3}Si_9Al_3O_1N_{15})$(Ca-α-SiAlON) that commonly contains Ca as a metal component, for Li. FIG. 1 shows an XRD spectrum of Li-α-SiAlON, and FIG. 2 shows an XRD spectrum of Ca-α-SiAlON. Accordingly, Li-α-SiAlON used in the present invention may have a different characteristic than Ca-α-SiAlON.

While α-type SiAlON containing Ca as a metal component has an emission central wavelength of about 600 nm, as described above, using Li-α-SiAlON having a central wavelength located within a band of 550 to 590 nm may increase visibility by about 25% with respect to emission of light having the same peak strength. More preferably, greater visibility may be achieved by enabling emission of light having a central wavelength in a wavelength band of 578 to 588 nm.

Figure 3:
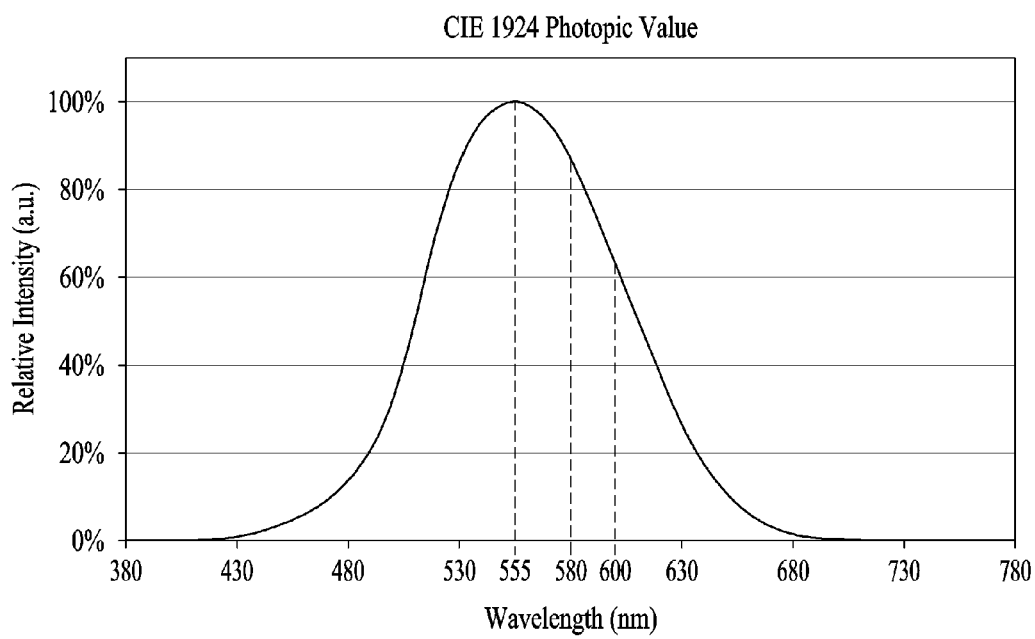
FIG. 3 is a graph showing a photopic curve that represents human visibility.

FIG. 3 is a graph showing a photopic curve that represents human visibility.

As shown, a value of human visibility becomes the maximum at a wavelength of about 555 nm. That is, humans sense that light having a wavelength of 555 nm is the strongest light with respect to the same luminous intensity.

Accordingly, Li-α-SiAlON having a central wavelength in a wavelength band of 550 to 590 nm, used in the present invention, may achieve greater visibility than α-type SiAlON that typically having an emission central wavelength of about 600 nm.

That is, a viewer can sense light having the same luminous intensity as if the light is brighter and, therefore, this emission wavelength adjustment may cause luminance increase effects.

Li-α-SiAlON, which may be used as the second phosphor according to the present invention, may improve visibility by about 25% as compared to Ca-α-SiAlON with respect to emission of light having the same peak strength.

In the present invention, to achieve emission of light having a central wavelength in a wavelength band of 550 to 590 nm, the substitution amount of Li as well as the amount of oxygen may be adjusted upon synthesis of SiAlON.

Table 1 shows emission wavelengths (peak wavelengths) and emission luminance of the second phosphor acquired by adjusting the amount of oxygen (n; the value in the above chemical formula 1).

For this emission, in the above chemical formula 1, "m" and "n" may fulfill at least one condition of $0 \le m \le 2$ and $0 \le n \le 1$. In addition, in the above chemical formula 1, "x" designates the amount of an activator (Eu) and is normally substituted with metal ions (lithium (Li) and aluminum (Al)) within a range of 10%. That is, "x" may have a value within a range of 0.01 to 0.1.

TABLE 1

| Amount of Oxygen (n) | Emission wavelength (nm) | Emission Luminance |
|---|---|---|
| 0 | 588 | 95% |
| 0.1 | 583 | 100% |
| 0.25 | 581 | 92% |
| 0.5 | 581 | 91% |
| 1 | 578 | 85% |
| 2 | 560 | 60% |

As can be seen from Table 1, an emission wavelength may vary according to the amount of oxygen in the second phosphor. That is, it can be appreciated that the emission wavelength is 588 nm and the emission luminance is 95% when the amount of oxygen (n) is 0 and that the emission wavelength may be reduced to 578 nm when the amount of oxygen (n) is 1.

In addition, in the case of varying the amount of oxygen (n) to a range of $1 \le n \le 2$ in order to improve emission efficiency via an additional visibility characteristic, it is possible to vary the emission wavelength to 560 nm. In this way, through adjustment in the amount of oxygen, an emission wavelength of the phosphor may be easily shifted to a shorter wavelength.

As can be seen from Table 1, the highest emission luminance is achieved when the amount of oxygen (n) is 0.1 and the emission wavelength is 583 nm.

As described above, the present invention may produce yellow light exhibiting excellent luminance by mixing the first phosphor as a green light emitting phosphor and the second phosphor as an amber light emitting phosphor.

In addition, improved emission luminance may be achieved by adjusting emission wavelengths of the first phosphor and the second phosphor and a mixing ratio thereof. Simultaneously, a color rendering index (CRI) that indicates a color rendering characteristic of a light source may be improved.

The color rendering index (CRI) is an index for indication of color rendering performance of a light source and has a numerical value that indicates a coincidence degree between color perception of an object under a sample light source and color perception of the same object under a prescribed reference light source.

Table 2 shows that luminance and CRI may be improved by mixing the first phosphor and the second phosphor as an amber light emitting phosphor as follows.

TABLE 2

| Phosphor | | Color Coordinates | | | Emission |
|---|---|---|---|---|---|
| | | CIEx | CIEy | CRI | Luminance |
| Yellow Phosphor | | 0.454 | 0.531 | 36.5 | 100 |
| 535 nm Green(%) | 600 nm Amber(%) | 0.458 | 0.513 | 48.5 | 89 |
| 535 nm Green(%) | 583 nm Amber(%) | 0.444 | 0.527 | 39.7 | 103.8 |

That is, it will be appreciated that the yellow light emitting phosphor using the first phosphor (having a peak wavelength of 535 nm) and the second phosphor (having a peak wavelength of 583 nm) according to the present invention may achieve superior emission luminance and CRI to a conventional yellow light emitting phosphor that uses a yellow phosphor (that refers to a typical widely used YGA phosphor) and Ca-α-SiAlON.

Example

Table 3 shows an example in which a yellow light emitting phosphor is acquired by mixing the first phosphor, e.g., LuAG that emits light of a 535 nm green wavelength (peak wavelength) band and the second phosphor, e.g., Li-α-SiAlON that emits light of a 583 nm amber wavelength (peak wavelength) band with each other.

TABLE 3

| Phosphor | | Color Coordinates | | CRI | Emission Luminance |
| --- | --- | --- | --- | --- | --- |
| | | CIEx | CIEy | | |
| Yellow Phosphor | | 0.454 | 0.531 | 36.5 | 100 |
| 535 nm Green (100%) | 583 nm Amber (0%) | 0.371 | 0.578 | 22.6 | 109.3 |
| 535 nm Green (90%) | 583 nm Amber (10%) | 0.385 | 0.568 | 26.4 | 107.8 |
| 535 nm Green (80%) | 583 nm Amber (20%) | 0.400 | 0.558 | 30.1 | 105.4 |
| 535 nm Green (70%) | 583 nm Amber (30%) | 0.414 | 0.548 | 33.6 | 104.9 |
| 535 nm Green (60%) | 583 nm Amber (40%) | 0.429 | 0.538 | 36.9 | 104.3 |
| 535 nm Green (50%) | 583 nm Amber (50%) | 0.444 | 0.527 | 39.7 | 103.8 |
| 535 nm Green (40%) | 583 nm Amber (60%) | 0.460 | 0.517 | 42.0 | 102.2 |
| 535 nm Green (30%) | 583 nm Amber (70%) | 0.475 | 0.506 | 43.4 | 99.3 |
| 535 nm Green (20%) | 583 nm Amber (80%) | 0.491 | 0.495 | 43.5 | 96.3 |
| 535 nm Green (10%) | 583 nm Amber (90%) | 0.507 | 0.484 | 41.8 | 90.0 |
| 535 nm Green (0%) | 583 nm Amber (100%) | 0.523 | 0.472 | 37.3 | 84.7 |

(% = wt %)

In this example, measured results of CRI and emission luminance in respective cases in which the amounts of the first phosphor and the second phosphor are adjusted respectively within a range of 0 to 100 wt % are shown in Table 3. That is, Table 3 shows the cases in which the amount of the first phosphor is sequentially reduced from 100 wt % to 0 wt % and the amount of the second phosphor is sequentially increased from 0 wt % to 100 wt %. Here, the amount (%) is percent by weight (wt %).

As a yellow phosphor for comparison, a YAG phosphor is used by way of example. In Table 3, the YAG phosphor has color coordinates of CIEx 0.454 and CIEy 0.531 and a CRI of 36.5. In this case, emission luminance of the YAG phosphor is set to 100.

As can be seen from Table 3, the yellow phosphor of the present invention achieves superior emission luminance to the conventional yellow phosphor in most cases. The emission luminance generally tends to be increased as the amount of the first phosphor is increased.

In addition, with regard to CRI, it can be appreciated that the yellow phosphor of the present invention achieves a higher CRI than that of the conventional yellow phosphor in the cases in which the amount of the first phosphor is 60 wt % or less and the amount of the second phosphor is 40 wt % or more. Accordingly, the CRI generally tends to be increased as the amount of the second phosphor is increased.

Considering the results related to CRI and emission luminance, it can be appreciated that the yellow light emitting phosphor of the present invention exhibits the best effects in the case in which a ratio of the first phosphor to the second phosphor is within a range of 60 wt % to 40 wt % (6:4) and 40 wt % to 60 wt % (4:6).

That is, the second phosphor may be present in an amount of 40 to 60 wt % when the sum of the first phosphor and the second phosphor is 100 wt %.

Particularly, it can be said, based on comprehensive consideration of CRI and emission luminance, that the yellow light emitting phosphor exhibits the best characteristics in the case in which a ratio of the first phosphor to the second phosphor is 50 wt % to 50 wt % (5:5).

Figure 4:
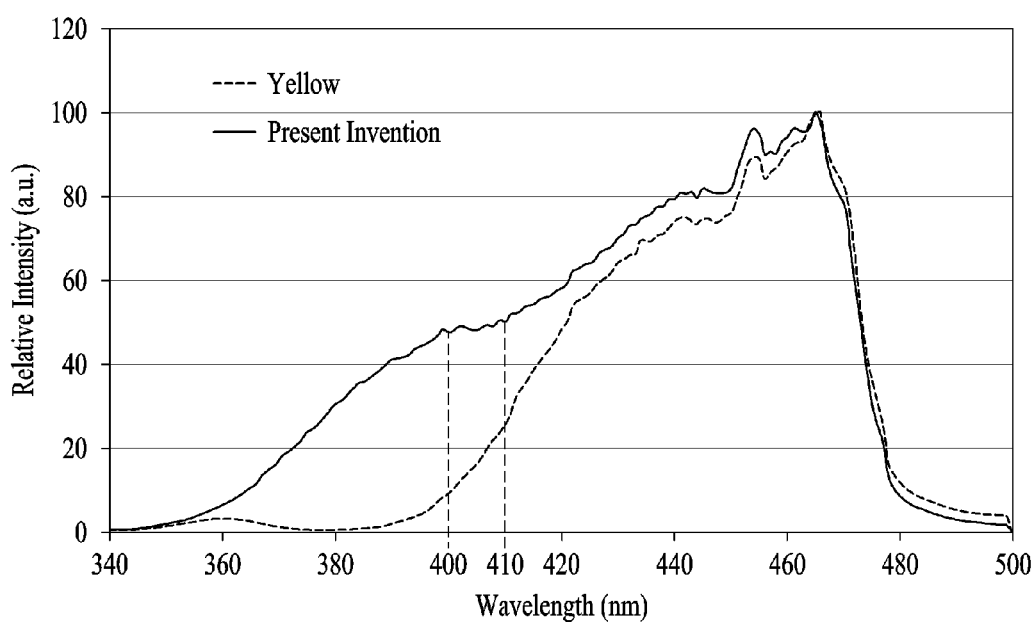
FIG. 4 is a graph showing an excitation spectrum of a yellow light emitting phosphor according to the present invention.

FIG. 4 is a graph showing an excitation spectrum of a yellow light emitting phosphor according to the present invention. The spectrum represents an excitation wavelength band for the yellow light emitting phosphor and an excitation degree at a corresponding wavelength according to the present invention.

As can be seen from FIG. 4, the yellow light emitting phosphor of the present invention has a superior excitation degree to a conventional yellow light emitting phosphor (e.g., a YAG phosphor) at short wavelengths.

For example, as shown, when an excitation wavelength is 410 nm, an excitation degree is kept at approximately half (half or more) a peak intensity at around 470 nm.

That is, the yellow light emitting phosphor according to the present invention may have an excitation rate of 50% or more as compared to a peak value at a wavelength of 410 nm of an excitation spectrum.

In addition, as can be seen from FIG. 4, the excitation degree is not considerably reduced even at shorter wavelengths than 410 nm. That is, the excitation rate at a wavelength of 400 nm is similar to that at a wavelength of 410 nm.

That is, the yellow light emitting phosphor according to the present invention may have a higher excitation rate than that of a YAG phosphor in a wavelength band of 450 nm or less of the excitation spectrum.

Near UV or blue light for excitation of phosphors exhibits greater excitation at shorter wavelengths. Therefore, it can be appreciated that the phosphor of the present invention, which exhibits excellent excitation at short wavelengths, has relatively excellent characteristics.

This is because near UV or blue light for excitation of phosphors exhibits enhanced emission intensity and emission quality at shorter wavelengths and a central wavelength of light emitting devices (e.g., LEDs) to emit such near UV or blue light is shifted to 450 nm or less as output thereof is increased.

For example, as can be seen from FIG. 4, the yellow light emitting phosphor represented by the dotted line exhibits remarkable reduction in excitation degree at shorter wavelengths and light conversion efficiency is reduced as output of light emitting devices to emit excitation light is increased.

On the other hand, it can be appreciated that the yellow light emitting phosphor of the present invention may achieve enhanced emission characteristics as output of light emitting devices that emit excitation light is increased.

Figure 5:
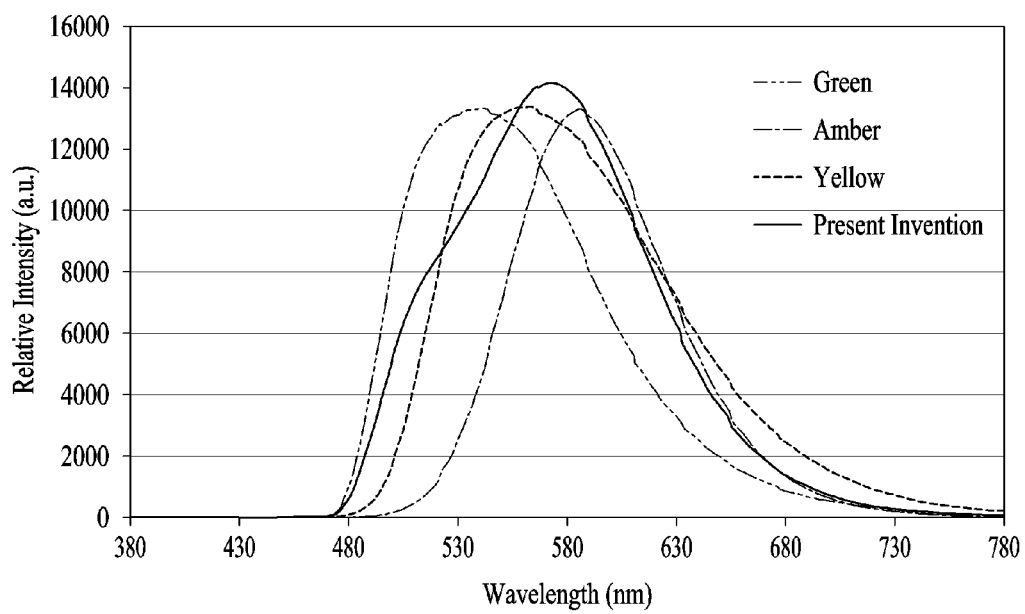
FIG. 5 is a graph showing an emission spectrum of a yellow light emitting phosphor according to the present invention.

FIG. 5 is a graph showing an emission spectrum of a yellow light emitting phosphor according to the present invention;

The yellow light emitting phosphor according to the present invention may achieve emission of yellow light as a combination of green light and amber light. As can be seen from FIG. 5, a spectrum of yellow light according to the present invention, represented by the solid line, has superior wavelength band and emission intensity to conventional yellow light represented by the dotted line.

Figure 6:
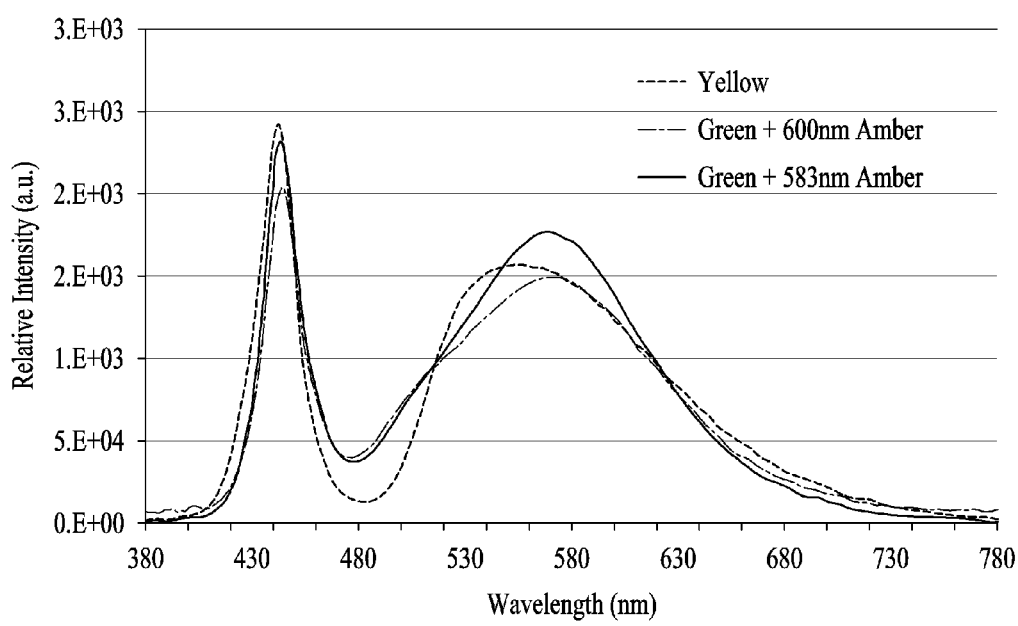
FIG. 6 is a graph showing an emission spectrum in the case of a white light emitting device package using a yellow light emitting phosphor according to the present invention.

FIG. 6 is a graph showing an emission spectrum in the case of a white light emitting device package using a yellow light emitting phosphor according to the present invention.

As exemplarily shown in FIG. 6, it can be appreciated that high quality white light may be emitted via combination of blue excitation light and yellow light emitted as the yellow light emitting phosphor according to the present invention is excited by the blue light.

That is, the yellow light emitting phosphor (a mixture of a green phosphor and a 583 nm amber phosphor) of the present invention exhibits a superior optical characteristic to a conventional yellow light emitting phosphor and another example (a mixture of a green phosphor and a 600 nm amber phosphor).

In this way, owing to high luminous intensity and excellent visibility within a yellow light emitting band, the yellow light emitting phosphor may produce high quality white light in cooperation with near UV or a blue light emitting device.

Comparative Example

Table 4 shows an example in which a yellow light emitting phosphor is acquired by mixing LuAG that emits light of a 535 nm green wavelength (peak wavelength) band (hereinafter referred to as a green phosphor) and Ca-α-SiAlON that emits light of a 600 nm amber wavelength (peak wavelength) band (hereinafter referred to as an amber phosphor) with each other.

TABLE 4

| Phosphor | | Color Coordinates | | | Emission |
| --- | --- | --- | --- | --- | --- |
| | | CIEx | CIEy | CRI | Luminance |
| Yellow Phosphor | | 0.454 | 0.531 | 36.5 | 100 |
| 535 nm Green (100%) | 600 nm Amber (0%) | 0.371 | 0.578 | 22.6 | 107 |
| 535 nm Green (90%) | 600 nm Amber (10%) | 0.388 | 0.566 | 28.0 | 103 |
| 535 nm Green (80%) | 600 nm Amber (20%) | 0.405 | 0.553 | 33.4 | 100 |
| 535 nm Green (70%) | 600 nm Amber (30%) | 0.422 | 0.540 | 38.7 | 96 |
| 535 nm Green (60%) | 600 nm Amber (40%) | 0.440 | 0.527 | 43.8 | 92 |
| 535 nm Green (50%) | 600 nm Amber (50%) | 0.458 | 0.513 | 48.5 | 89 |
| 535 nm Green (40%) | 600 nm Amber (60%) | 0.477 | 0.499 | 52.3 | 85 |
| 535 nm Green (30%) | 600 nm Amber (70%) | 0.497 | 0.485 | 54.4 | 81 |
| 535 nm Green (20%) | 600 nm Amber (80%) | 0.517 | 0.470 | 54.1 | 78 |
| 535 nm Green (10%) | 600 nm Amber (90%) | 0.538 | 0.454 | 50.3 | 74 |
| 535 nm Green (0%) | 600 nm Amber (100%) | 0.559 | 0.438 | 42.0 | 70 |

(% = wt %)

In this example, similar to Table 3, measured results of CRI and emission luminance in respective cases in which the amounts of the green phosphor and the amber phosphor are adjusted respectively within a range of 0 to 100 wt % are shown in Table 4. That is, Table 4 shows the cases in which a yellow phosphor as a comparison reference is a YAG phosphor. Here, the amount (%) is percent by weight (wt %).

As can be seen from Table 4, the yellow phosphor as a comparison reference has a superior CRI and inferior emission luminance to a conventional yellow phosphor. In addition, as shown, CRI is reduced when emission luminance is increased.

<Light Emitting Device Package>

Figure 7:
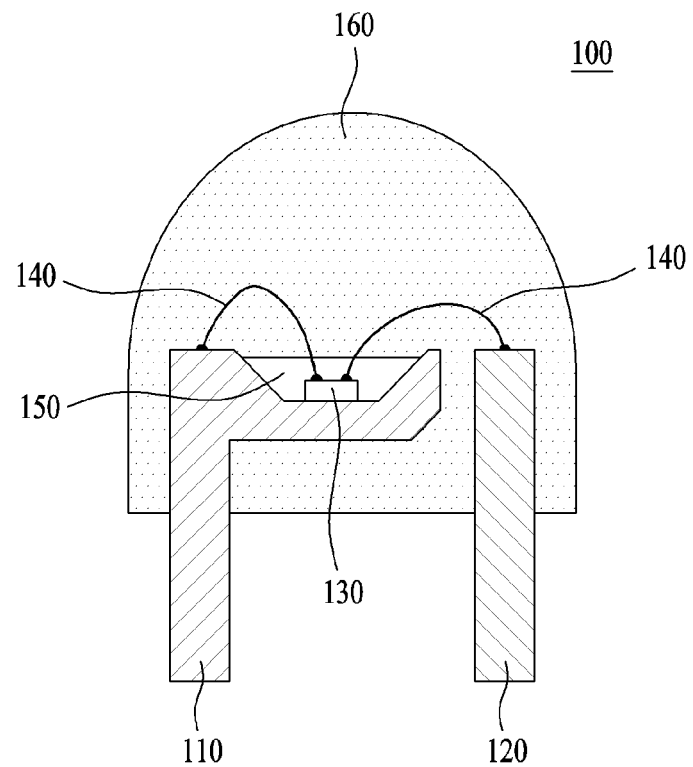
FIG. 7 is a sectional view showing one example of a light emitting device package using a yellow light emitting phosphor according to the present invention.

FIG. 7 is a sectional view showing one example of a light emitting device package using a yellow light emitting phosphor according to the present invention. Specifically, FIG. 7 shows an example of a lamp type light emitting device package 100 according to one embodiment of the present invention.

The lamp type white light emitting device package 100 includes a pair of lead frames 110 and 120 and a light emitting device 130 that generates light upon voltage application.

The light emitting device 130 is electrically connected to the lead frames 110 and 120 via wires 140 and a light transmission material 150 is molded over the light emitting device 130. The light emitting device 130 may emit near UV or blue light.

In addition, instead of the light emitting device to emit near UV, other light emitting devices that have a main emission peak wavelength within the same wavelength range, such as a laser diode, surface emission laser diode, inorganic electroluminescent device, organic electroluminescent device, and the like, may be used. In the present invention, use of a nitride semiconductor light emitting diode is described as a preferred application example. In FIG. 7, the light emitting device 130 is schematically shown, and any one of horizontal and vertical nitride semiconductor light emitting diodes may be used.

The light transmission material 150 may include phosphors 170 and 171 (see FIG. 8) uniformly dispersed therein, and a shell material 160 may be provided on the light transmission material 150 to finish an exterior space of the entire device.

The used phosphors 170 and 171 may include not only the yellow light emitting phosphor including the first phosphor 170 and the second phosphor 171 as described above, but also another phosphor, e.g., a red light emitting phosphor 172 that is also dispersed in the light transmission material 150. In some cases, the dispersed phosphor 172 may include two or more kinds of phosphors.

The light transmission material 150, which is used to form a molding member, may be selected from among light transmissive epoxy resin, silicon resin, polyimide resin, urea resin, acryl resin, and the like. Preferably, the light transmissive epoxy resin or the light transmissive silicon resin may be used.

While the light transmission material 150 of the present embodiment may be molded around the entire light emitting device 130, the light transmission material 150 may be partially molded only on a light emitting region as needed.

This is because, in the case in which a high-output light emitting device 130 having a large size is wholly molded, this may have a negative effect on uniform dispersion of the phosphors 170 and 171 in the light transmission material 150. In this case, partially molding the light transmission material 150 only at a light emitting region may be advantageous.

Figure 8:
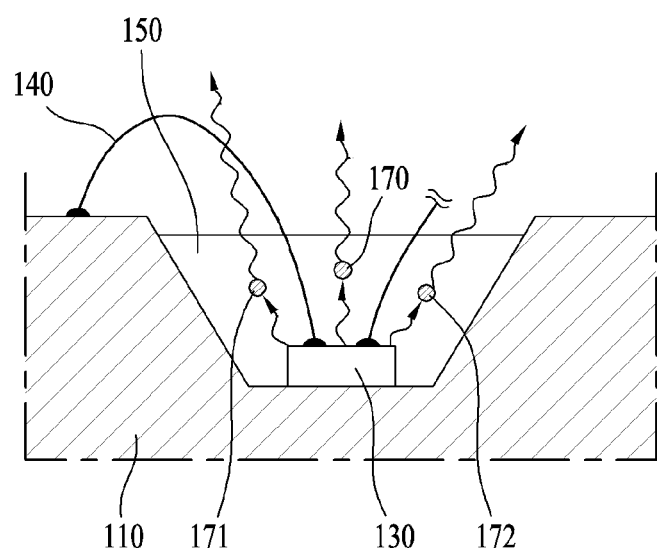
FIG. 8 is a sectional view showing another example of a light emitting device package using a yellow light emitting phosphor according to the present invention.
Figure 9:
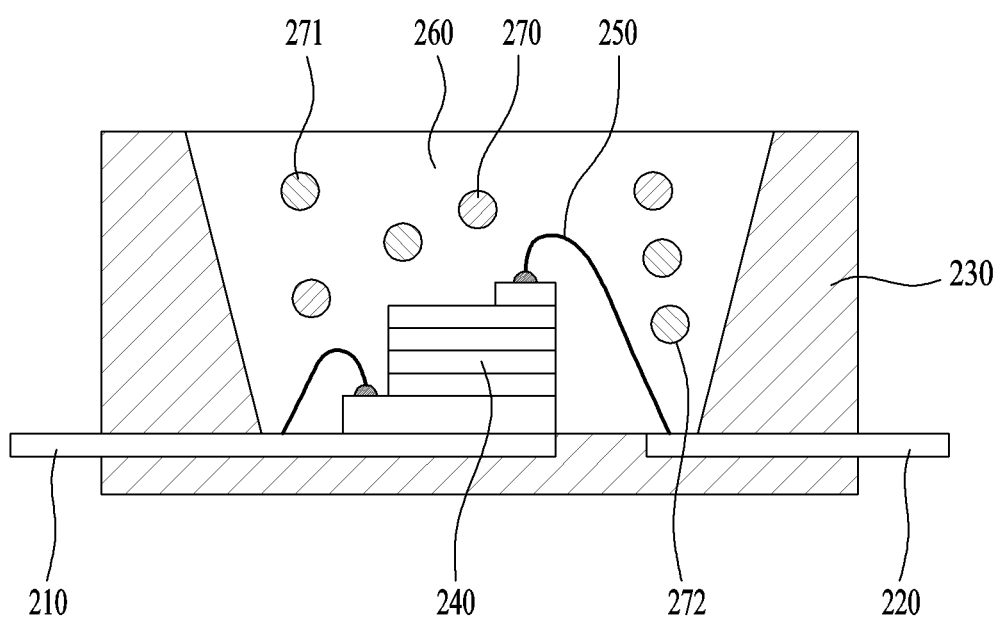
FIG. 9 is a partial enlarged view of FIG. 7 showing a process of producing white light using a yellow light emitting phosphor according to the present invention.

FIG. 9 is a sectional view showing another example of a light emitting device package using a yellow light emitting phosphor according to the present invention. FIG. 8 shows a surface-mount type light emitting device package 200.

The surface-mount type light emitting device package 200 according to one embodiment of the present invention, as exemplarily shown in FIG. 8, includes cathode and anode lead frames 210 and 220, and a light emitting device 240 disposed on any one of the cathode and anode lead frames 210 and 220 to generate light upon voltage application. The light emitting device 240 may be a light emitting diode or laser diode.

While FIG. 9 shows an example of the light emitting device 240 having a horizontal structure, of course, a light emitting device having a vertical structure may be used.

The light emitting device 240 is electrically connected to the lead frames 210 and 220 via wires 250, and a light transmission material 260 is molded over the light emitting device 240. The lead frames 210 and 220 may be secured to a package body 230, and the package body 230 may take the form of a reflector cup.

In addition, phosphors 270 and 271 may be dispersed in the light transmission material 260.

The used phosphors 270 and 271 may respectively include the first phosphor 270 and the second phosphor 271 as described above, which are mixed with one another and dispersed in the light transmission material 260, and another phosphor may be mixed and dispersed. For example, a red light emitting phosphor 272 may additionally be dispersed. In some cases, the disposed phosphor 272 may include two or more kinds of phosphors.

The light transmission material 260, which is used to form a molding member, may be selected from among light transmissive epoxy resin, silicon resin, polyimide resin, urea resin, acryl resin, and the like. Preferably, the light transmissive epoxy resin or the light transmissive silicon resin may be used.

While the light transmission material 260 may be molded around the entire light emitting device 240, the light transmission material 260 may be partially molded only on a light emitting region as needed.

A description of the other parts not described herein may be replaced with the above description of the same parts with reference to FIG. 7.

The light emitting device package 100; 200 according to the present invention as described above in detail may be a white light emitting device package.

FIG. 8 is a partial enlarged view of FIG. 7 showing a process of producing white light. The following description may be equally applied to the case shown in FIG. 8.

Blue light within a wavelength range of 400 to 480 nm, which corresponds to near UV or blue light emitted from the light emitting device 130; 240, passes through the phosphors 170 and 171; 270 and 271. Some of the light is used to excite the phosphors 170 and 171; 270 and 271 to generate light having an emission central wavelength located within a range of 500 to 600 nm as exemplarily shown in FIG. 6 and the other blue light directly passes through the phosphors 170 and 171; 270 and 271.

As a result, white light having a spectrum of a wide wavelength within a range of 400 to 700 nm may be emitted.

The phosphors 170 and 171; 270 and 271 may be disposed along with another phosphor (172) in addition to the above-described oxide nitride phosphor.

For example, the phosphors 170 and 171; 270 and 271 may be mixed with a phosphor (third phosphor) having a different emission peak wavelength, rather than being mixed with the yellow light emitting phosphor as described above.

Although the exemplary embodiments have been illustrated and described as above, of course, it will be apparent to those skilled in the art that the embodiments of the present invention are provided to assist understanding of the present invention and the present invention is not limited to the above described particular embodiments, and various modifications and variations can be made in the present invention without departing from the spirit or scope of the present invention, and the modifications and variations should not be understood individually from the viewpoint or scope of the present invention.

What is claimed is:

1. A yellow light emitting phosphor comprising:
a first phosphor including at least one of $Lu_3Al_5O_{12}$:Ce, and $SrSi_2O_2N_2$; and
a second phosphor mixed with the first phosphor to form a mixture, the second phosphor including α-type SiAlON(Li-α-SiAlON) containing Li as a metal component, wherein the second phosphor emits light having a central wavelength in a wavelength band of 550 nm to 590 nm by being excited by near ultraviolet (UV) or blue light,
wherein the mixture of the first phosphor and the second phosphor is excited by the near UV or blue light to emit yellow light,
wherein an excitation rate of the mixture is 50% or more as compared to a peak value at a wavelength of 410 nm of an excitation spectrum.

2. The yellow light emitting phosphor according to claim 1, wherein the second phosphor is represented by the following chemical formula 1:

$$Li_{m-2x}Eu_xSi_{12-(m+n)}Al_{m+n}O_nN_{16-n}$$

where, "x", "m" and "n" fulfill at least one condition of $0.01 \leq x \leq 0.1$, $0 \leq m \leq 2$ and $0 \leq n \leq 1$.

3. The yellow light emitting phosphor according to claim 1, wherein the second phosphor is present in an amount of 40 wt % to 60 wt % when the sum of the first phosphor and the second phosphor is 100 wt %.

4. The yellow light emitting phosphor according to claim 1, wherein the phosphor has a higher excitation rate than that of an yttrium aluminum garnet (YAG) phosphor in a wavelength band of 360 nm to 460 nm of an excitation spectrum.

5. The yellow light emitting phosphor according to claim 1, wherein the second phosphor emits light having a central wavelength located within a wavelength band of 578 nm to 588 nm.

6. The yellow light emitting phosphor according to claim 1, further comprising a third phosphor emitting light in a red wavelength band.

7. A yellow light emitting phosphor comprising:
a first phosphor emitting light having a central wavelength in a wavelength band of 530 nm to 550 nm, wherein the first phosphor includes at least one of $Lu_3Al_5O_{12}$:Ce and $SrSi_2O_2N_2$; and
a second phosphor emitting light having a central wavelength in a wavelength band of 550 nm to 590 nm by being mixed with the first phosphor,
wherein the second phosphor is represented by the following chemical formula 1:

$$Li_{m-2x}Eu_xSi_{12-(m+n)}Al_{m+n}O_nN_{16-n}$$

where, "x", "m" and "n" fulfill at least one condition of $0.01 \leq x \leq 0.1$, $0 \leq m \leq 2$ and $0 \leq n \leq 1$, and
wherein the phosphor has a higher excitation rate than that of a yttrium aluminum garnet (YAG) phosphor in a wavelength band of 360 nm to 460 nm of an excitation spectrum.

8. The yellow light emitting phosphor according to claim 7, wherein the second phosphor is present in an amount of 40 wt % to 60 wt % when the sum of the first phosphor and the second phosphor is 100 wt %.

9. The yellow light emitting phosphor according to claim 7, wherein the excitation rate is 50% or more as compared to a peak value at a wavelength of 410 nm of the excitation spectrum.

10. The yellow light emitting phosphor according to claim 7, wherein the second phosphor emits light having a central wavelength located within a wavelength band of 578 nm to 588 nm.

11. A yellow light emitting phosphor comprising:
a first phosphor including at least one of $Lu_3Al_5O_{12}$:Ce, and $SrSi_2O_2N_2$; and
a second phosphor mixed with the first phosphor to form a mixture, the second phosphor including α-type SiAlON(Li-α-SiAlON) containing Li as a metal component, wherein the second phosphor emits light having a central wavelength in a wavelength band of 578 nm to 588 nm by being excited by near ultraviolet (UV) or blue light, wherein the second phosphor is present in an amount of 40 wt % to 60 wt % when the sum of the first phosphor and the second phosphor is 100 wt %, and wherein the mixture of the first phosphor and the second phosphor is excited by the near UV or blue light to emit yellow light.

12. A light emitting device package comprising:

the yellow light emitting phosphor according to claim 1; and a light emitting device configured to emit near ultraviolet (UV) or blue light to excite the yellow light emitting phosphor.

* * * * *